(12) United States Patent
Garvi Jimenez-Ortiz et al.

(10) Patent No.: US 11,791,833 B2
(45) Date of Patent: Oct. 17, 2023

(54) POWER AND SIGNAL-TO-NOISE RATIO REGULATION IN A VCO-ADC

(71) Applicant: Infineon Technologies AG, Neubiberg (DE)

(72) Inventors: Ruben Garvi Jimenez-Ortiz, Madrid (ES); Luis Hernandez-Corporales, Madrid (ES); Guillermo Alejandro Lopez Fernandez, Madrid (ES); Carlos Andres Perez Cruz, Santa Cruz del Retamar (ES); Andres Quintero Alonso, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 344 days.

(21) Appl. No.: 17/194,697

(22) Filed: Mar. 8, 2021

(65) Prior Publication Data
US 2022/0286774 A1    Sep. 8, 2022

(51) Int. Cl.
  *H03M 1/12*    (2006.01)
  *H03K 3/03*    (2006.01)
  *H03M 1/60*    (2006.01)
  *H04R 19/04*   (2006.01)

(52) U.S. Cl.
  CPC .......... *H03M 1/12* (2013.01); *H03K 3/0315* (2013.01); *H03M 1/124* (2013.01); *H03M 1/125* (2013.01); *H03M 1/60* (2013.01); *H04R 19/04* (2013.01); *H04R 2201/003* (2013.01); *H04R 2410/03* (2013.01)

(58) Field of Classification Search
  CPC .. H03K 3/0315; H03K 3/0322; H03L 7/0995; H03M 1/60; H03M 1/125; H03M 1/1245; H03M 1/12
  See application file for complete search history.

(56) References Cited

U.S. PATENT DOCUMENTS

| | | | | |
|---|---|---|---|---|
| 5,821,821 A * | 10/1998 | Ahdab | ................. | H03K 3/0315 331/34 |
| 5,994,968 A * | 11/1999 | Iravani | ................. | H03K 3/0231 331/34 |
| 10,270,460 B1 * | 4/2019 | Buffa | ...................... | H03M 1/60 |
| 10,734,977 B1 * | 8/2020 | Yu | ...................... | H03M 1/1245 |
| 10,886,930 B1 | 1/2021 | Buffa et al. | | |
| 2010/0090771 A1 * | 4/2010 | Shin | .................... | H03K 3/0315 331/57 |

(Continued)

OTHER PUBLICATIONS

Gielen, G. G. E., et al., "Time-Encoding Analog-to-Digital Converters: Bridging the Analog Gap to Advanced Digital CMOS—Part2: Architectures and Circuits," in IEEE Solid-State Circuits Magazine, vol. 12, No. 3, Aug. 2020, 10 pages . . . .

(Continued)

*Primary Examiner* — Ryan Johnson
(74) *Attorney, Agent, or Firm* — Slater Matsil, LLP

(57) ABSTRACT

A voltage-controlled oscillator analog-to-digital converter (VCO-ADC) includes a first source follower coupled between a first input terminal and a first internal node; a first VCO having an input coupled to a second internal node; a first variable resistor coupled between the first internal node and the second internal node; and a digital signal processing component coupled between an output of the first VCO and a output terminal.

14 Claims, 13 Drawing Sheets

(56) References Cited

U.S. PATENT DOCUMENTS

2011/0095928 A1* 4/2011 Hagihara ............. H03K 5/1504
341/166
2018/0335509 A1* 11/2018 Aksin ................ G01R 31/2635

OTHER PUBLICATIONS

Nguyen, Viet et al., "A 0.2-V 30-MS/s 11 b-ENOB Open-Loop VCO-Based ADC in 28-nm CMOS", IEEE Solid-State Circuits Letters, vol. 1, No. 9, Sep. 2018 (Sep. 2018), pp. 190-193, XP011720427.
Gielen, G. G. E., et al., "Time-Encoding Analog-to-Digital Converters: Bridging the Analog Gap to Advanced Digital CMOS—Part 1: Basic Principles," in IEEE Solid-State Circuits Magazine, vol. 12, No. 2, pp. 47-55, Spring 2020.

* cited by examiner

| Resistor Value (Ω) | Resistor Mode | Oscillator's rest frequency (f0) [MHz] | Current Consumption [nA] | SNR(dBA) |
|---|---|---|---|---|
| 0 | Short | 19,44 | 277 | 71,5 |
| 470,7 | R1 | 17,3 | 242 | 71 |
| 892,2 | R2 | 15,8 | 220 | 70,8 |
| 1615,7 | R3 | 13,99 | 193 | 70,2 |
| 2391,2 | R4 | 12,52 | 173 | 69,5 |
| 3114,2 | R5 | 11,49 | 160 | 69,1 |
| 4211,2 | R6 | 10,28 | 144 | 68,5 |
| 6480,5 | R7 | 8,57 | 125 | 67,8 |
| 9469,4 | R8 | 7,19 | 87 | 67,3 |

POWER AND SIGNAL-TO-NOISE RATIO REGULATION IN A VCO-ADC

TECHNICAL FIELD

Embodiments of the present invention relate generally to a system and method of power and signal-to-noise ratio regulation in a voltage controlled oscillator analog-to-digital converter (VCO-ADC).

BACKGROUND

Currently many digital microphones available in the market are based on switched-capacitor sigma-delta analog-to-digital converter (ADC) implementations. In the switched-capacitor sigma-delta ADC technology, changes in quantization noise and power are accomplished by changing the frequency of a system clock. Different power modes can therefore be selected by changing the frequency of the system clock of the microphone integrated circuit. One issue associated with changing the frequency of the system clock is that, in order to avoid sound artefacts when changing between modes, a constant data rate is be kept at the output. But when the system clock frequency is changed, the sampling frequency is also changed. Digital interpolators having a variable interpolation function, in order to keep the constant data rate, are therefore sometimes used. The interpolator adds to the overall power consumption of the microphone and to the total silicon area of the microphone integrated circuit. Furthermore, care has to be taken to avoid the interpolator adding noise during transitions between different operational modes.

SUMMARY

According to an embodiment a voltage-controlled oscillator analog-to-digital converter (VCO-ADC) includes a first source follower coupled between a first input terminal and a first internal node; a first VCO having an input coupled to a second internal node; a first variable resistor coupled between the first internal node and the second internal node; and a digital signal processing component coupled between an output of the first VCO and a output terminal.

According to an embodiment a voltage-controlled oscillator (VCO) circuit includes a source follower; a variable resistor having a control signal input; and a VCO, wherein a current path of the VCO, a current path of the variable resistor, and a current path of the source follower are in series communication.

According to an embodiment a method of operating a voltage-controlled oscillator analog-to-digital converter (VCO-ADC) including a variable resistor in a current path of a VCO of the VCO-ADC includes placing the VCO-ADC into a first operational mode by setting the variable resistor to a first resistor value; and placing the VCO-ADC into a second operational mode by setting the variable resistor to a second resistor value different from the first resistor value.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A system and method to change the power and the quantization noise of a digital microphone is described herein. By changing the rest frequency of a VCO in the VCO-ADC of the digital microphone, power and quantization noise can be selected in two or more operational modes. Switching between operational modes can be accomplished quickly and in fine steps while the digital microphone integrated circuit is online, and substantially without audio artefacts. The rest frequency of the VCO is changed by the use of a variable resistor in series with a source follower. In embodiments, the variable resistor can comprise a plurality of switchable resistor components in turn comprising a plurality of switching transistors or transfers gates coupled to a corresponding plurality of resistor elements.

To use the advantages of smaller CMOS technologies, interest is moving towards VCO based solutions instead of switched capacitor based solutions. In the VCO based solutions, a change of the clock frequency is not needed to trade quantization noise and power in the analog front-end. In the VCO based solutions quantization noise is determined by the rest frequency of the voltage-controlled oscillator (VCO). Thus methods to change the rest frequency of the VCO online are required. The differences between the switched capacitor and VCO approaches are described below with respect to the block diagrams of FIG. 1 and FIG. 2.

Figure 1:
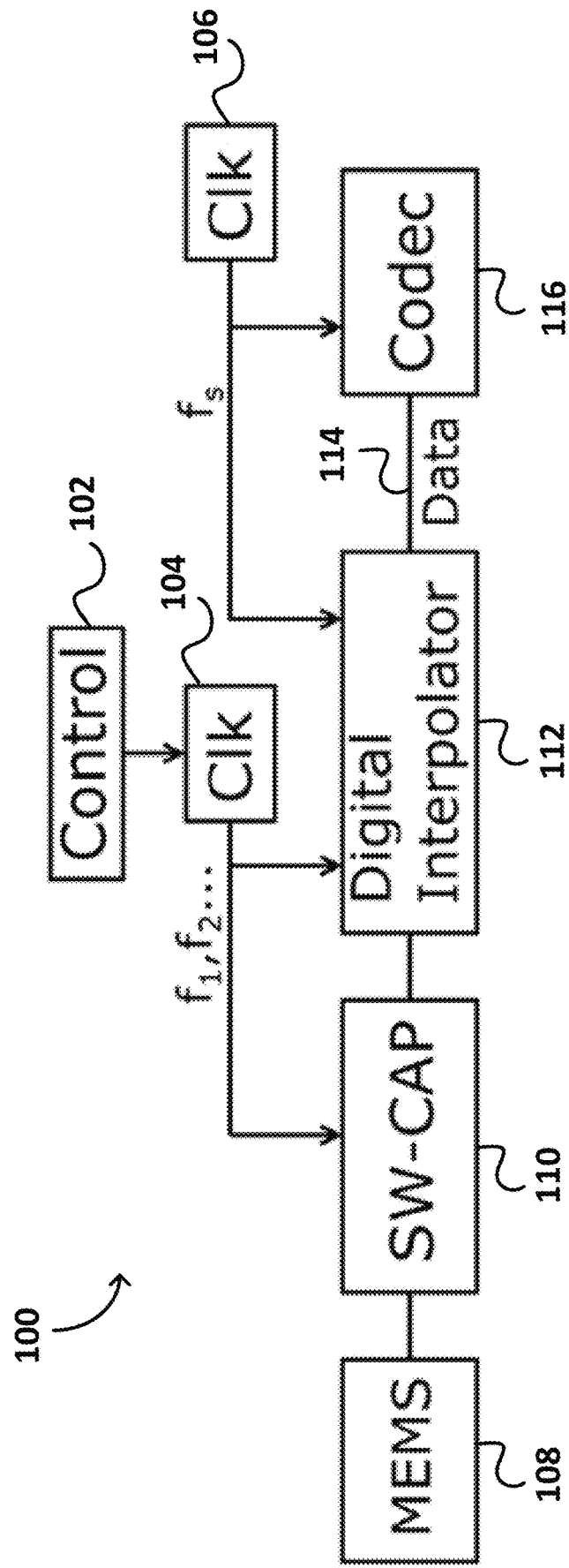
FIG. 1 is a block diagram of an exemplary switched capacitor sigma-delta ADC microphone implementation.

FIG. 1 is a block diagram of an exemplary switched capacitor sigma-delta ADC digital microphone implementation 100. Digital microphone 100 comprises a microelectromechanical system (MEMS) device 108 having an analog output coupled to a switched capacitor ADC 110. The switched capacitor ADC 110 converts the analog output signal of MEMS device 108 into a digital output signal. The digital output signal is interpolated by digital interpolator 112 to provide constant frequency output data 114. The output data 114 is received by codec 116 for further digital signal processing. A first clock generator 104 provides a plurality of different frequency clock signals $f_1$, $f_2$, as well as other frequency clock signals under the control of a control circuit 102 such as a microprocessor. Clock signals $f_1$, $f_2$, as well as any other different frequency clock signals are received by switched capacitor ADC 110 and digital interpolator 112. A second clock generator 106 provides a system clock signal $f_s$, which is received by digital interpolator 112 and codec 116.

Figure 2:
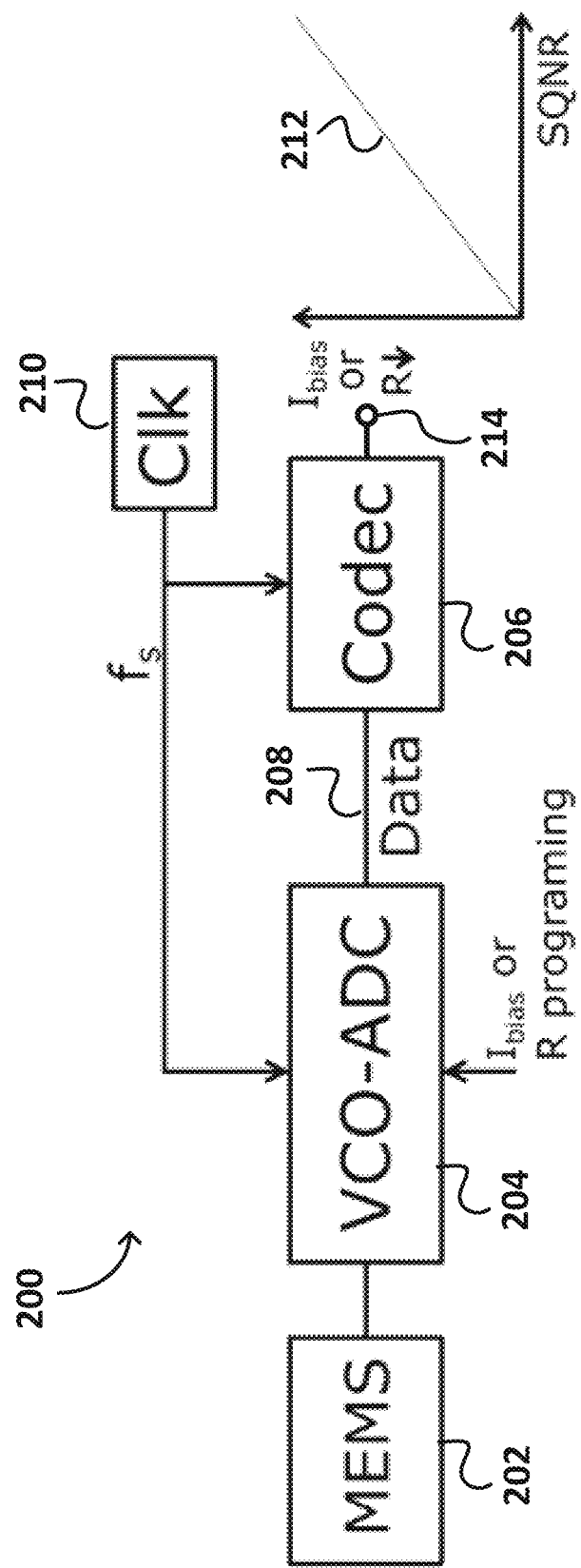
FIG. 2 is a block diagram of a VCO-ADC microphone implementation according to an embodiment.

FIG. 2 is a block diagram of a VCO-ADC digital microphone implementation 200 according to an embodiment. Digital microphone 200 comprises a microelectromechanical system (MEMS) device 202 having an analog output coupled to a VCO-ADC 204. The VCO-ADC 204 converts the analog output signal of MEMS device 202 into a digital output signal designated "Data" at node 208. VCO-ADC 204 includes a variable bias current $I_{bias}$ that may be provided by programming a variable resistor according to an embodiment, which will be described in further detail below. The rest frequency of the VCO of VCO-ADC 204 can be set by changing the bias current $I_{bias}$ by using a $g_m$ transconductor or with the variable resistor when using a source follower (SF) embodiment. The digital output signal of VCO-ADC 204 is received by codec 206 for further digital signal processing and to provide a further processed output signal at codec output node 214. A clock generator 210 provides a system clock signal $f_s$, which is received by VCO-ADC 204 and codec 206. The graph shown in FIG. 2 shows a relationship 212 between the bias current of the VCO-ADC 204 and the signal-to-quantization-noise ratio (SQNR) of digital microphone 200. Increasing the bias current of VCO-ADC 204 increases the SQNR of digital microphone 200. Similarly, decreasing the value of the variable resistor associated with VCO-ADC 204 also increases the SQNR of digital microphone 200.

Figure 3:
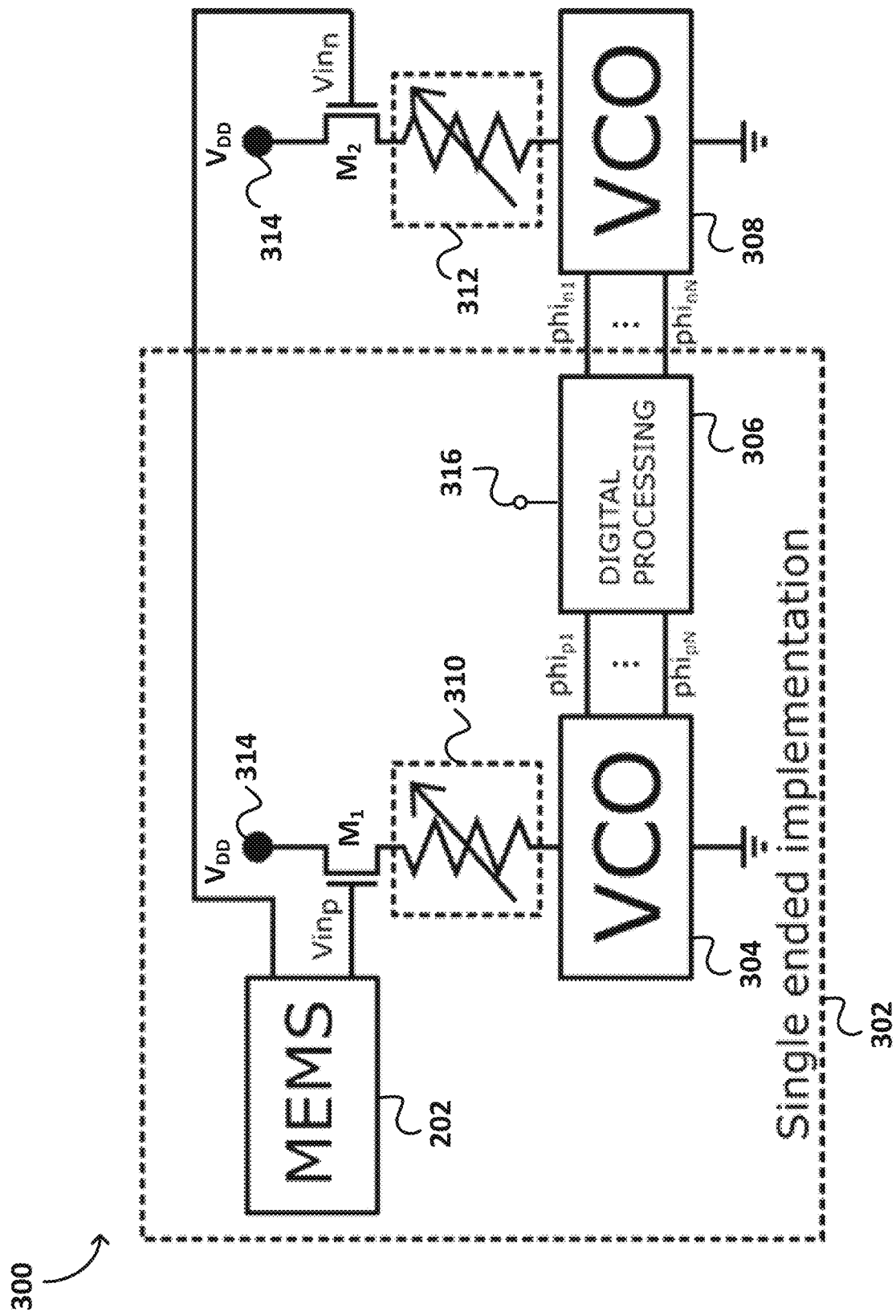
FIG. 3 is a schematic diagram of a VCO-ADC having a variable resistor and source follower circuitry for controlling the operational mode of the microphone implementation shown in FIG. 2, according to an embodiment.

FIG. 3 is a schematic diagram of a VCO-ADC 300 having a variable resistor 310, 312 coupled to source follower circuitry $M_1$, $M_2$ for controlling the operational mode of the digital microphone implementation 200 shown in FIG. 2, according to an embodiment. MEMS device 202 is also shown coupled to VCO-ADC 300 in FIG. 3 for proper context. MEMS device 202 is the same as is shown in digital microphone 200 shown in FIG. 2. Digital processing component 306 of VCO-ADC 300 can include codec 206 shown in FIG. 2 and/or other digital processing components shown in FIG. 4 as is described in further detail below. VCO 304 and/or VCO 308 correspond to the VCO(s) of VCO-ADC 204 shown in FIG. 2. The output phase signals of VCO 304 $phi_{p1}$ through $phi_{pN}$ are received by a first set of inputs of digital processing component 306. The output phase signals of VCO 308 $phi_{n1}$ through $phi_{nN}$ are received by a second set of inputs of digital processing component 306.

In FIG. 3, the gate of source follower transistor $M_1$ receives the $Vin_p$ output signal from MEMS device 202, and the gate of source follower transistor $M_2$ receives the $Vin_n$ output signal from MEMS device 202. The drains of source follower transistors $M_1$ and $M_2$ are coupled to a source of supply voltage at node 314. In an embodiment, the source of supply voltage can comprise a positive supply voltage $V_{DD}$. Variable resistor 310 is coupled between a source of source follower transistor $M_1$ and a bias current input (current path) of VCO 304. The bias current input is a voltage input of VCO 304 when the source follower embodiment is used. Variable resistor 312 is coupled between a source of source follower transistor $M_2$ and a bias current input (current path) of VCO 308. In FIG. 3, the digital output of VCO-ADC 300 is represented by digital output terminal 316 of digital processing component 306.

Thus, VCO-ADC 300 can be configured in a single-ended implementation 302 or in fully differential configuration (including all of the elements of VCO-ADC 300). In an embodiment, a variable resistor 310 or 312 is coupled in series with the current paths of source follower transistor $M_1$ or source follower $M_2$ and the current paths of VCO 304 or VCO 308 as previously described. Thus, by varying the resistance of variable resistor 310 the current flowing through source follower transistor $M_1$, variable resistor 310, and VCO 304 changes, and the voltage drop in VCO 304 also changes. Similarly, by varying the resistance of variable resistor 312 the current flowing through source follower transistor $M_2$, variable resistor 312, and VCO 308 changes, and the voltage drop in VCO 308 also changes. The change in variable resistors 310 and 312 in turn changes the rest frequency of VCOs 304 and 308. By changing the rest frequency of the VCO, the quantization noise SQNR(dB) of the VCO-ADC 300 can also be changed. This relationship between rest frequency and quantization noise is shown in expression [1] where $f_o$ represents the rest frequency of the VO, $f_s$ the sampling frequency used, and ABW is the analog bandwidth of the VCO-ADC, in an embodiment.

$$SQNR(dB) = 6\log_2 \frac{2f_0}{f_s} - 5.17 + 9\log_2 \frac{f_S}{2ABW} \quad [1]$$

Referring again to FIG. 3, the change of the rest frequency of the VCO(s) 304, 308 is performed in a manner that can be best understood by the use of Ohm's law. Both the variable resistor(s) 310, 312 and the VCO(s) 304, 308 can be seen as a resistive load for the source follower transistor(s) $M_1$, $M_2$. The current flowing through the source follower transistor(s) $M_1$, $M_2$ is the same that the current flowing through the resistive load described above. Due to the fact that the voltage drop in the resistive load is fixed by the voltage seen at the gate of the source follower transistor(s) $M_1$, $M_2$, the current flowing in both the source follower transistor(s) $M_1$, $M_2$ and the VCO(s) 304, 308 is determined according to Ohm's law by the voltage drop in the resistive load (VCO(s) 304, 308 plus variable resistor(s) 310, 312) divided by the resistance of the resistive load. This way, when the resistance of the variable resistor(s) 310, 312 is increased, the current in the VCO(s) 304, 308 is decreased. Thus, the rest frequency of the VCO(s) 304, 308 is also decreased.

Referring again to FIG. 3, the variable resistor(s) 310, 312 are connected to low impedance nodes. A low impedance node comprises the source(s) of source follower transistor(s) $M_1$, $M_2$. The use of low impedance nodes allows the rapid change of the biasing conditions of the VCO(s) 304, 308, and thus advantageously makes possible the online change between different power modes of VCO-ADC 300. This rapid change of biasing conditions is not possible by simply changing the bias voltage at the gate of the source follow transistor(s) $M_1$, $M_2$ as these gate node(s) are high impedance node(s), which makes the switching between modes too slow to be practical. It has been observed, for example, that changing the bias voltage at the high impedance gate(s) of source follower transistor(s) $M_1$, $M_2$ can result in VCO-ADC settling times on the order of seconds. Furthermore, shorting the high ohmic gate(s) of source follower transistor (s) M1, M2 to try and reduce the transition time between different power modes produces audible "clicks" or other audio artefacts in the digital microphone output signal.

Figure 4:
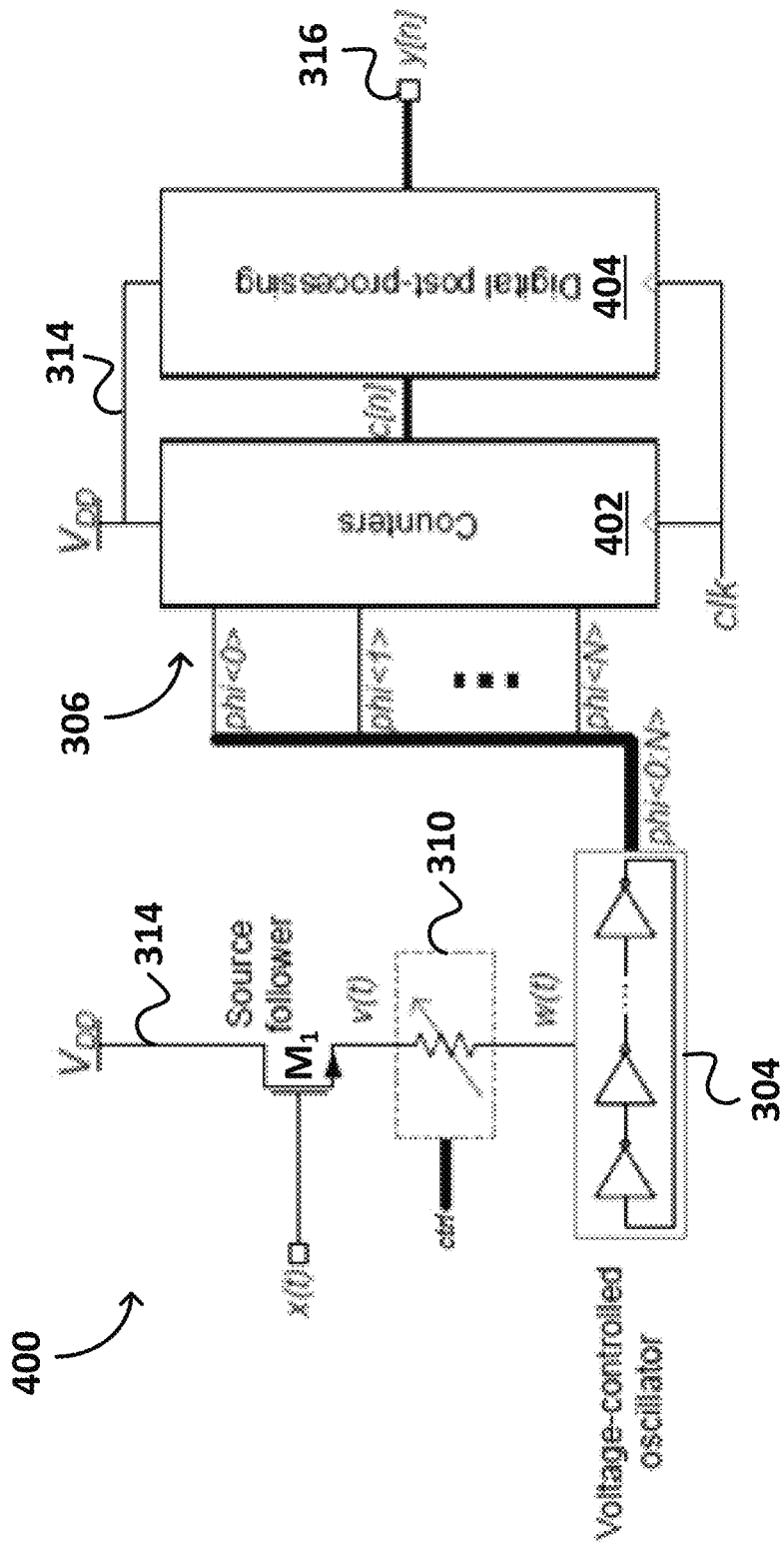
FIG. 4 is a more detailed schematic of the VCO-ADC of FIG. 3, according to an embodiment.

FIG. 4 is a more detailed schematic of the VCO-ADC 300 of FIG. 3, according to an embodiment. VCO-ADC 400 of FIG. 4 shows source follower transistor $M_1$ as an NMOS transistor having a gate for receiving the generalized analog input signal X(t), a drain coupled to the $V_{DD}$ source of positive supply voltage at node 314, and a source for providing the source follower voltage V(t). VCO 304 is shown as comprising a plurality of serially coupled inverters having a bias input voltage W(t). Variable resistor 310 is coupled between the source of source follower transistor $M_1$ (V(t)) and the bias input of VCO 304 (W(t)). The phase output signals of VCO 304 phi<0:N> are received by inputs of signal processing component 306. Signal processing component 306 comprises a plurality of counters 402 corresponding to the plurality of phase output signals, and provides a digital output signal C[n]. A digital post-processing component 404 can include codec 206 shown in FIG. 2 as well as other digital processing components. Digital post-processing component 404 can be implemented in one or more integrated circuits along with counters 402. Digital post-processing component 404 can also be implemented as part of a microprocessor executing a sequence of instructions. Examples of other digital signal processing components for use in VCO-ADCs can be found in co-pending U.S. patent application Ser. No. 17/159,833, entitled "Coarse-Fine Counting Architecture for a VCO-ADC Based on Interlocked Binary Asynchronous Counters" that is hereby incorporated by reference in its entirety; in co-pending U.S. patent application Ser. No. 16/526,346, entitled "Voltage Controlled Oscillator Based Analog-to-Digital Converter Including a Maximum Length Sequence Generator" that is hereby incorporated by reference in its entirety; and in U.S. Pat. No. 10,270,460, entitled "Coarse-Fine Quantization Architecture for Multiphase VCO-Based ADCs" that is hereby incorporated by reference in its entirety. The digital output signal of VCO-ADC 400 provides a digital output signal Y[n] that is a digital representation of analog input signal X(t) at digital output terminal 316. Counters 402 and digital post-processing component 404 are coupled to the $V_{DD}$ source of supply voltage at node 314, and also receive the system clock signal labeled "clk" in FIG. 4, which has a frequency of $f_s$ as is shown in FIG. 2.

FIGS. 5-7 and FIGS. 8-10 show several example implementations of a VCO circuit for use with a VCO-ADC having NMOS source followers and PMOS source followers, respectively. In general, the VCO circuit includes a stacked configuration of a source follower, a variable resistor, and a VCO, each having a current path in series communication. Two differences in the implementations include the relative positions of the variable resistor, the source follower, and the VCO in the stacked configuration, and the technical implementation of the switches for selectively switching resistor elements of the variable resistors. Regarding the relative position of the variable resistor in the stacked configuration, the variable resistor can be either located between the source follower and the VCO or between the VCO and ground for an NMOS implementation or a power supply for a PMOS implementation. The switches can be implemented with transmission gates or single transistors. The relative positions of the variable resistor and the switch implementations of the VCO circuit are both described in further detail below with respect to FIGS. 5-7 and 8-10.

All of the example VCO circuit implementations shown in FIGS. 5-7 and FIGS. 8-10 are shown as differential architectures, however it is apparent that these circuit implementations can also be used in single ended architectures by using only one half of the circuit.

Figure 5:
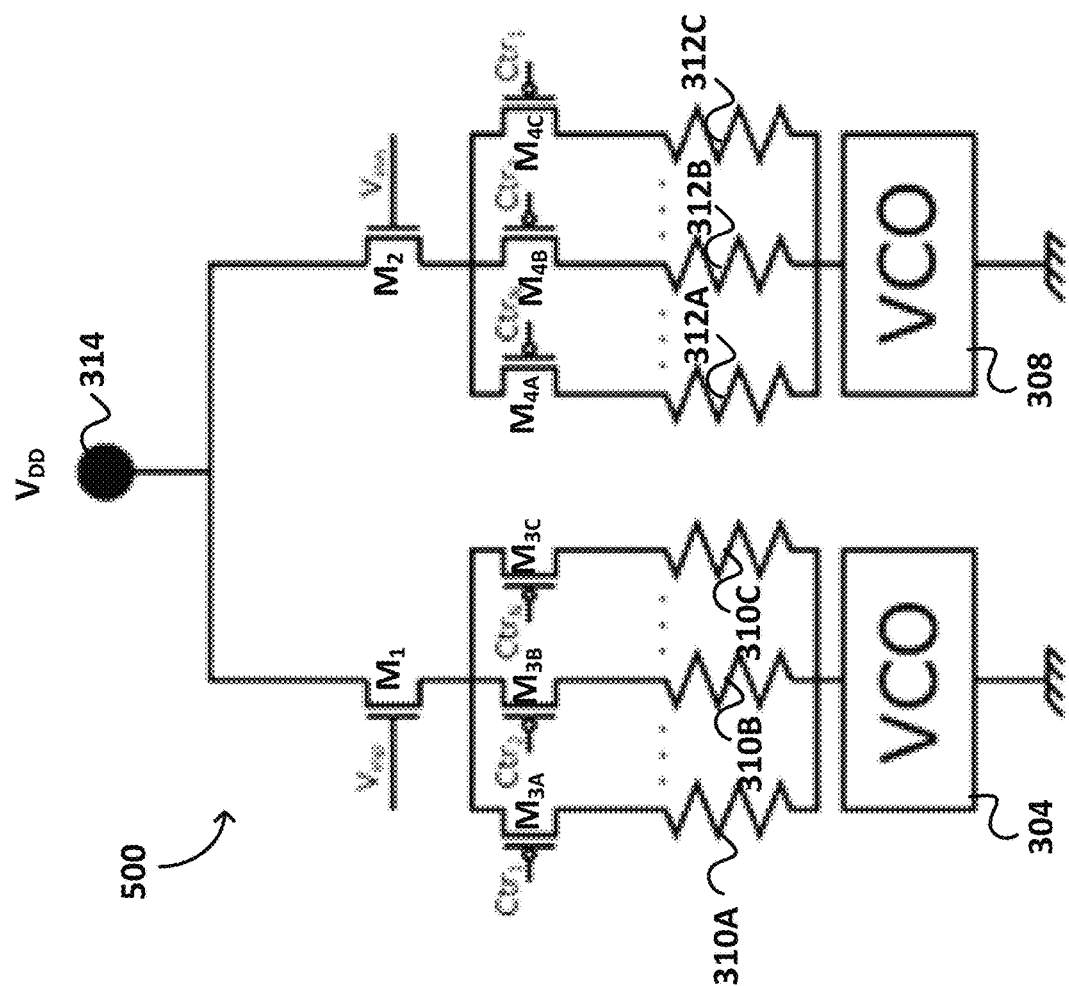
FIG. 5 is a schematic diagram of a VCO circuit having NMOS source followers and PMOS transistors for switching resistor elements, according to an embodiment.

FIG. 5 shows an example VCO circuit 500 having a first NMOS source follower transistor $M_1$ having a gate for receiving the $Vin_p$ input signal, a drain coupled to the VDD supply voltage at node 314, and a first plurality of switchable resistor components coupled to the source of source follower transistor $M_1$. A first switchable resistor component comprises a first PMOS switching transistor $M_{3A}$ coupled to a first resistor element 310A, wherein the gate of transistor $M_{3A}$ receives the $Ctr_1$ control signal. A second switchable resistor component comprises a second PMOS switching transistor $M_{3B}$ coupled to a second resistor element 310B, wherein the gate of transistor $M_{3B}$ receives the $Ctr_2$ control signal. A third switchable resistor component comprises a third PMOS switching transistor $M_{3C}$ coupled to a third resistor element 310C, wherein the gate of transistor $M_{3C}$ receives the $Ctr_N$ control signal. While three switchable resistor components are shown in FIG. 5, any number may be used. The three switchable resistor components are coupled to the supply voltage input of first VCO 304, which in turn is coupled to ground.

FIG. 5 shows the example VCO circuit 500 having a second NMOS source follower transistor $M_2$ having a gate for receiving the $Vin_n$ input signal, a drain coupled to the VDD supply voltage at node 314, and a second plurality of switchable resistor components coupled to the source of source follower transistor $M_2$. A first switchable resistor component comprises a first PMOS switching transistor $M_{4A}$ coupled to a first resistor element 312A, wherein the gate of transistor $M_{4A}$ receives the $Ctr_N$ control signal. A second switchable resistor component comprises a second PMOS switching transistor $M_{4B}$ coupled to a second resistor element 312B, wherein the gate of transistor $M_{4B}$ receives the $Ctr_2$ control signal. A third switchable resistor component comprises a third PMOS switching transistor $M_{4C}$ coupled to a third resistor element 312C, wherein the gate of transistor $M_{4C}$ receives the $Ctr_1$ control signal. While three switchable resistor components are shown in FIG. 5, any number may be used. The three switchable resistor components are coupled to the supply voltage input of second VCO 308, which in turn is coupled to ground.

Figure 6:
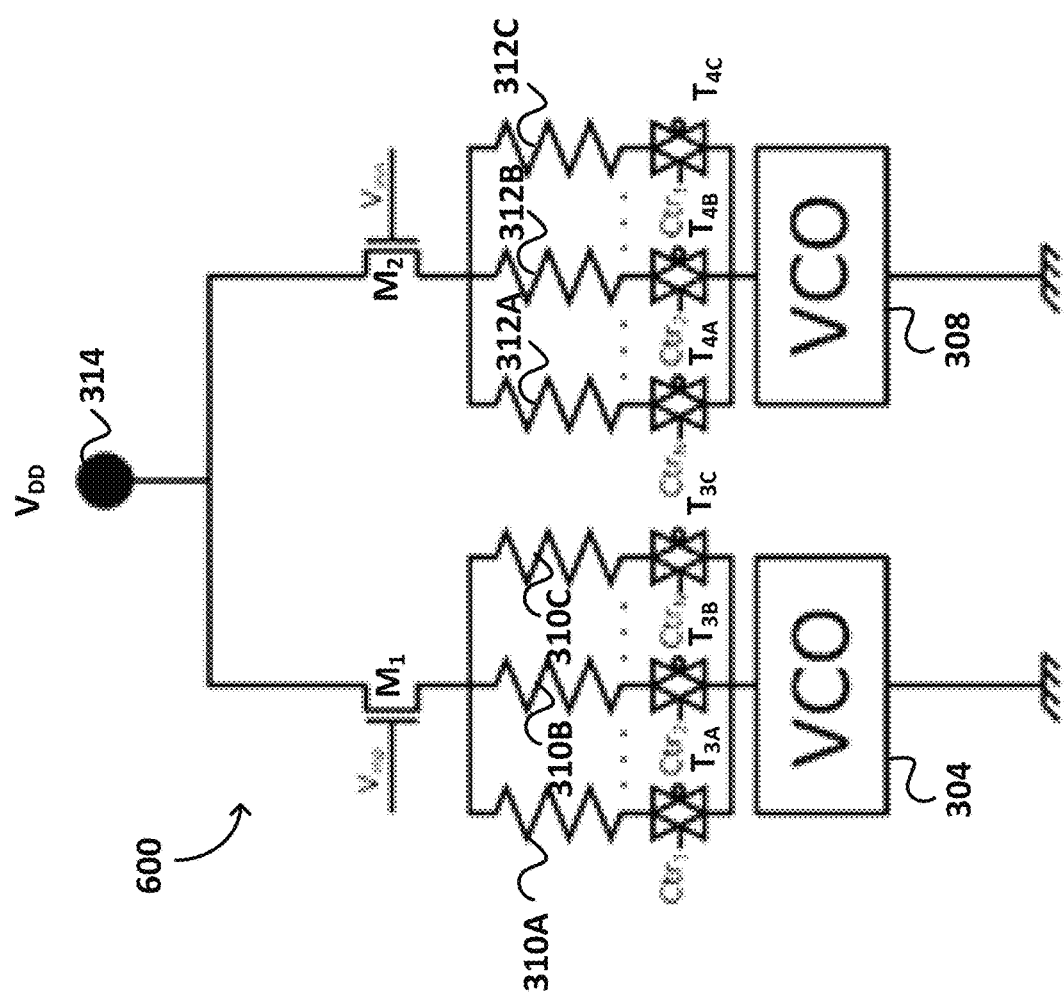
FIG. 6 is a schematic diagram of a VCO circuit having NMOS source followers and transfer gates for switching resistor elements, according to an embodiment.

FIG. 6 shows an example VCO circuit 600 having a first NMOS source follower transistor $M_1$ having a gate for receiving the $Vin_p$ input signal, a drain coupled to the VDD supply voltage at node 314, and a first plurality of switchable resistor components coupled to the source of source follower transistor $M_1$. A first switchable resistor component comprises a first transmission gate $T_{3A}$ coupled to a first resistor element 310A, wherein the gate of transmission gate $T_{3A}$ receives the $Ctr_1$ control signal and an inverted control signal. A second switchable resistor component comprises a second transmission gate $T_{3B}$ coupled to a second resistor element 310B, wherein the gate of transmission gate $T_{3B}$ receives the $Ctr_2$ control signal and an inverted control signal. A third switchable resistor component comprises a third transmission gate $T_{3C}$ coupled to a third resistor element 310C, wherein the gate of transmission gate $T_{3C}$ receives the $Ctr_N$ control signal and an inverted control signal. While three switchable resistor components are shown in FIG. 6, any number may be used. The three switchable resistor components are coupled to the supply voltage input of first VCO 304, which in turn is coupled to ground.

FIG. 6 shows the example VCO circuit 600 having a second NMOS source follower transistor $M_2$ having a gate for receiving the $Vin_n$ input signal, a drain coupled to the VDD supply voltage at node 314, and a second plurality of switchable resistor components coupled to the source of source follower transistor $M_2$. A first switchable resistor component comprises a first transmission gate $T_{4A}$ coupled to a first resistor element 312A, wherein the gate of transmission gate $T_{4A}$ receives the $Ctr_N$ control signal and an inverted control signal. A second switchable resistor component comprises a second transmission gate $T_{4B}$ coupled to a second resistor element 312B, wherein the gate of transmission gate $T_{4B}$ receives the $Ctr_2$ control signal and an inverted control signal. A third switchable resistor component comprises a third transmission gate $T_{4C}$ coupled to a third resistor element 312C, wherein the gate of transmission gate $T_{4C}$ receives the $Ctr_1$ control signal and an inverted control signal. While three switchable resistor components are shown in FIG. 6, any number may be used. The three switchable resistor components are coupled to the supply voltage input of second VCO 308, which in turn is coupled to ground.

Figure 7:
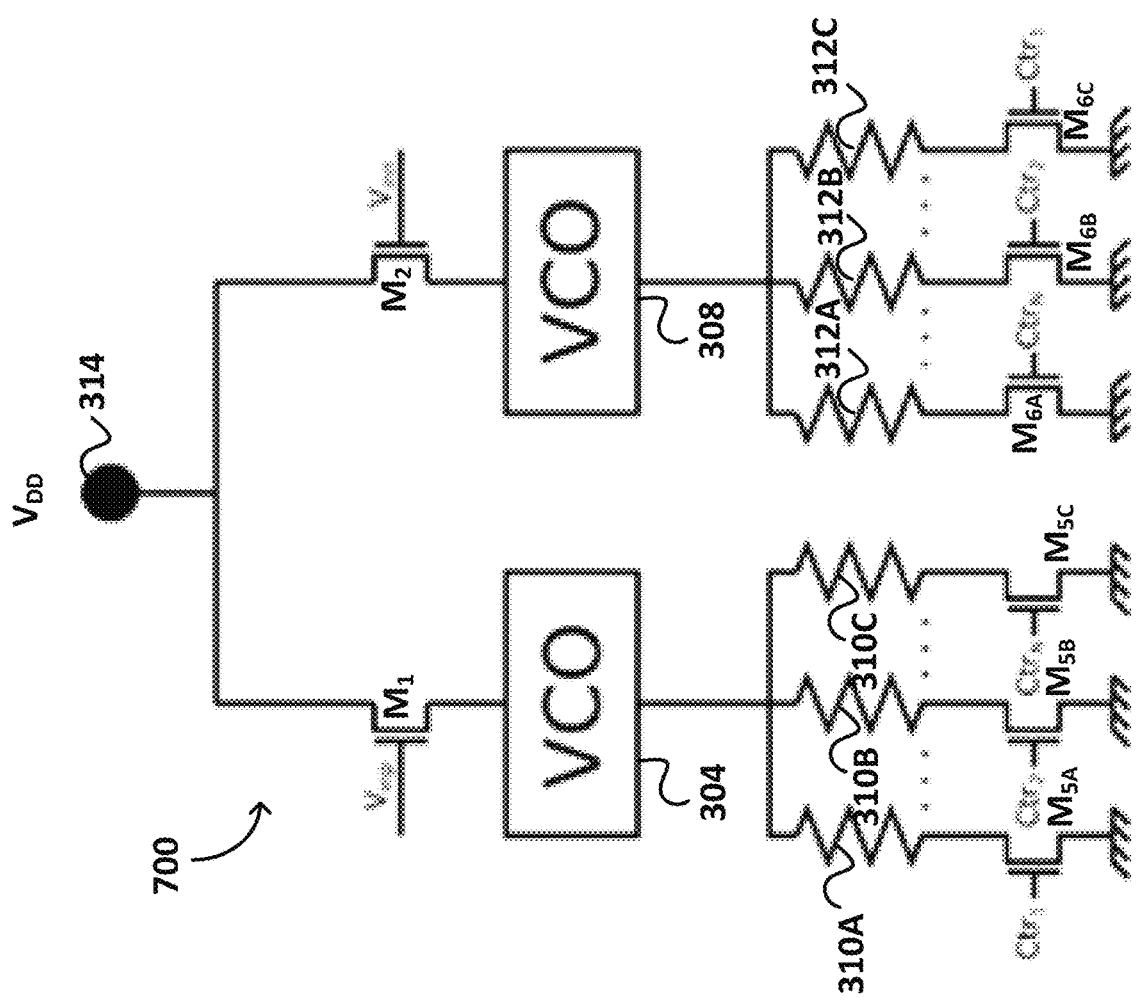
FIG. 7 is a schematic diagram of a VCO circuit having NMOS source followers and NMOS transistors for switching resistor elements, according to an embodiment.

FIG. 7 shows an example VCO circuit 700 having a first NMOS source follower transistor $M_1$ having a gate for receiving the $Vin_p$ input signal, a drain coupled to the VDD supply voltage at node 314, and a first current terminal of first VCO 304 coupled to the source of source follower transistor $M_1$. A first plurality of switchable resistor components is coupled to a second current terminal of first VCO 304. A first switchable resistor component comprises a first NMOS switching transistor $M_{5A}$ coupled to a first resistor element 310A, wherein the gate of transistor $M_{5A}$ receives the $Ctr_1$ control signal. A second switchable resistor component comprises a second NMOS switching transistor $M_{5B}$ coupled to a second resistor element 310B, wherein the gate of transistor $M_{5B}$ receives the $Ctr_2$ control signal. A third switchable resistor component comprises a third NMOS switching transistor $M_{5C}$ coupled to a third resistor element 310C, wherein the gate of transistor $M_{5C}$ receives the $Ctr_N$ control signal. While three switchable resistor components are shown in FIG. 7, any number may be used.

FIG. 7 shows the example VCO circuit 700 having a second NMOS source follower transistor $M_2$ having a gate for receiving the $Vin_n$ input signal, a drain coupled to the VDD supply voltage at node 314, and a first current terminal of second VCO 308 coupled to the source of source follower transistor $M_2$. A second plurality of switchable resistor components is coupled to a second current terminal of second VCO 308. A first switchable resistor component comprises a first NMOS switching transistor $M_{6A}$ coupled to a first resistor element 312A, wherein the gate of transistor $M_{6A}$ receives the $Ctr_N$ control signal. A second switchable resistor component comprises a second NMOS switching transistor $M_{6B}$ coupled to a second resistor element 312B, wherein the gate of transistor $M_{6B}$ receives the $Ctr_2$ control signal. A third switchable resistor component comprises a third NMOS switching transistor $M_{6C}$ coupled to a third resistor element 312C, wherein the gate of transistor $M_{6C}$ receives the $Ctr_1$ control signal. While three switchable resistor components are shown in FIG. 7, any number may be used.

Figure 8:
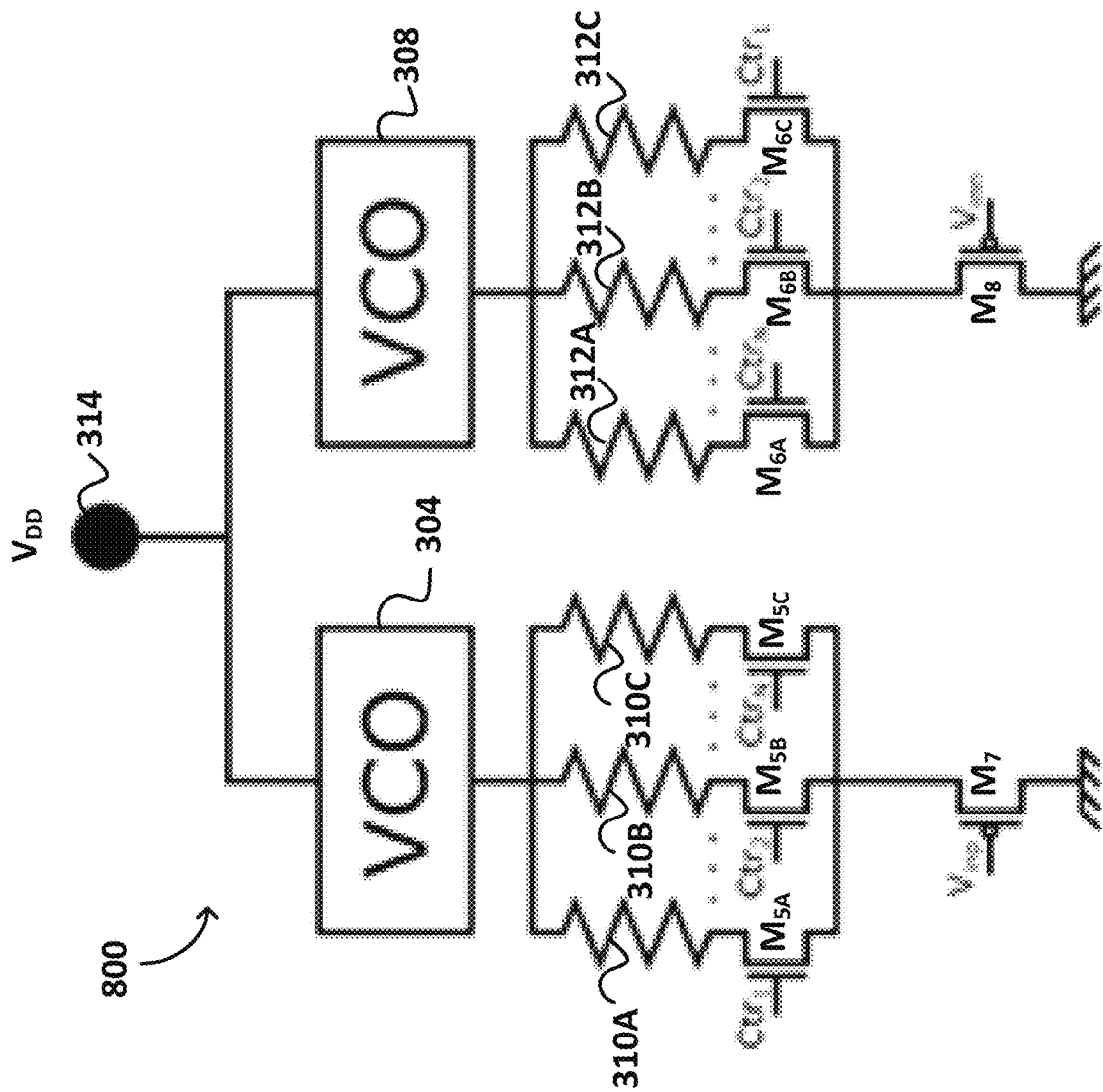
FIG. 8 is a schematic diagram of a VCO circuit having PMOS source followers and NMOS transistors for switching resistor elements, according to an embodiment.

FIG. 8 shows an example VCO circuit 800 having a first PMOS source follower transistor $M_7$ having a gate for receiving the $Vin_p$ input signal, a drain coupled to ground, and a first plurality of switchable resistor components coupled to the source of source follower transistor $M_7$. A first switchable resistor component comprises a first NMOS switching transistor $M_{5A}$ coupled to a first resistor element 310A, wherein the gate of transistor $M_{5A}$ receives the $Ctr_1$ control signal. A second switchable resistor component comprises a second NMOS switching transistor $M_{5B}$ coupled to a second resistor element 310B, wherein the gate of transistor $M_{5B}$ receives the $Ctr_2$ control signal. A third switchable resistor component comprises a third NMOS switching transistor $M_{5C}$ coupled to a third resistor element 310C, wherein the gate of transistor $M_{5C}$ receives the $Ctr_N$ control signal. While three switchable resistor components are shown in FIG. 8, any number may be used. The three switchable resistor components are coupled to the supply voltage input of first VCO 304, which in turn is coupled to the $V_{DD}$ power supply at node 314.

FIG. 8 shows the example VCO circuit 800 having a second PMOS source follower transistor $M_8$ having a gate for receiving the $Vin_n$ input signal, a drain coupled to ground, and a second plurality of switchable resistor components coupled to the source of source follower transistor $M_8$. A first switchable resistor component comprises a first NMOS switching transistor $M_{6A}$ coupled to a first resistor element 312A, wherein the gate of transistor $M_{6A}$ receives the $Ctr_N$ control signal. A second switchable resistor component comprises a second NMOS switching transistor $M_{6B}$ coupled to a second resistor element 312B, wherein the gate of transistor $M_{6B}$ receives the $Ctr_2$ control signal. A third switchable resistor component comprises a third NMOS switching transistor $M_{6C}$ coupled to a third resistor element 312C, wherein the gate of transistor $M_{6C}$ receives the $Ctr_1$ control signal. While three switchable resistor components are shown in FIG. 8, any number may be used. The three switchable resistor components are coupled to the supply voltage input of second VCO 308, which in turn is coupled to the $V_{DD}$ power supply voltage at node 314.

Figure 9:
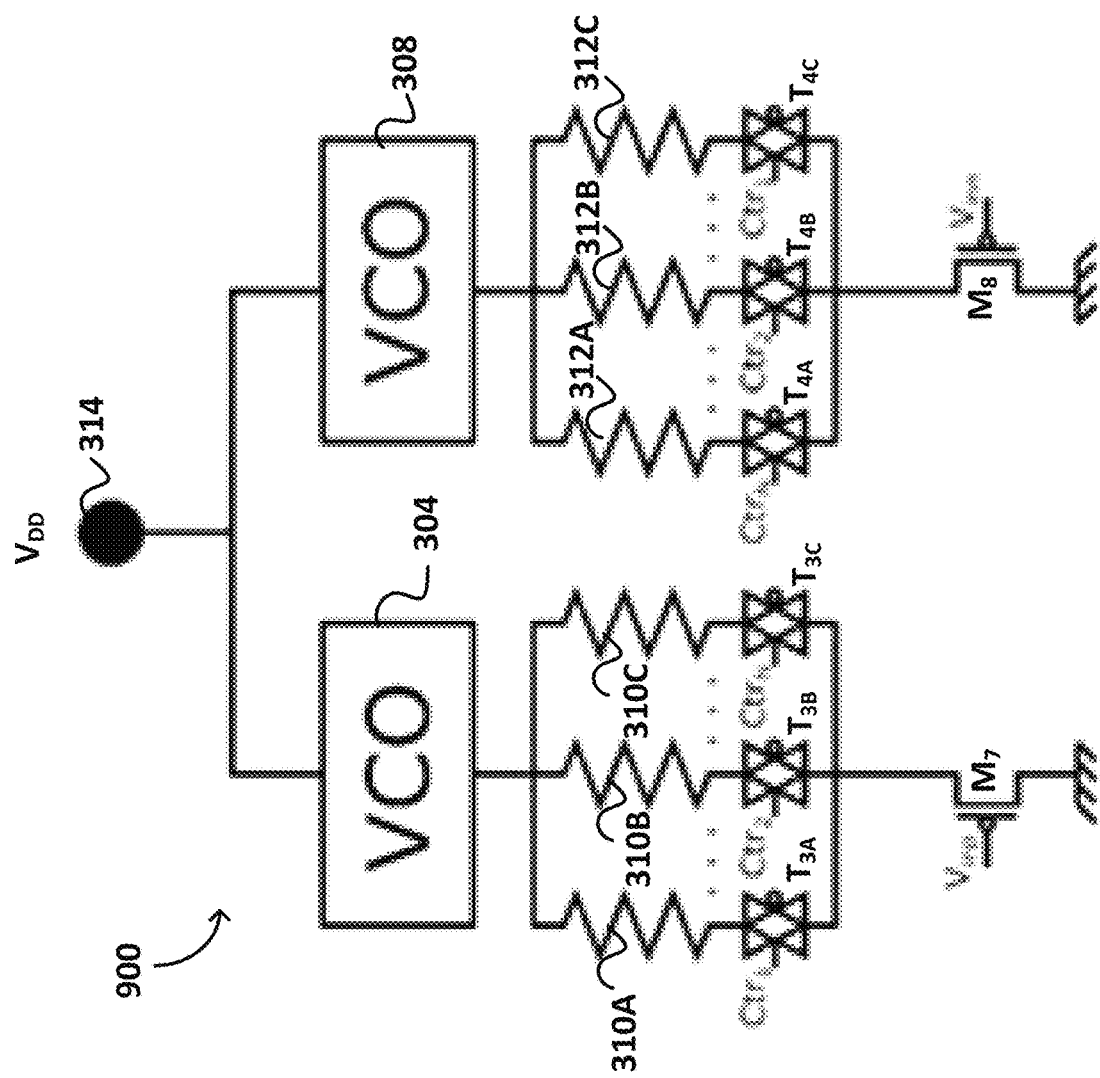
FIG. 9 is a schematic diagram of a VCO circuit having PMOS source followers and transfer gates for switching resistor elements, according to an embodiment.

FIG. 9 shows an example VCO circuit 900 having a first PMOS source follower transistor $M_7$ having a gate for receiving the $Vin_p$ input signal, a drain coupled to the ground, and a first plurality of switchable resistor components coupled to the source of source follower transistor $M_7$. A first switchable resistor component comprises a first transmission gate $T_{3A}$ coupled to a first resistor element 310A, wherein the gate of transmission gate $T_{3A}$ receives the $Ctr_1$ control signal and an inverted control signal. A second switchable resistor component comprises a second transmission gate $T_{3B}$ coupled to a second resistor element 310B, wherein the gate of transmission gate $T_{3B}$ receives the $Ctr_2$ control signal and an inverted control signal. A third switchable resistor component comprises a third transmission gate $T_{3C}$ coupled to a third resistor element 310C, wherein the gate of transmission gate $T_{3C}$ receives the $Ctr_N$ control signal and an inverted control signal. While three switchable resistor components are shown in FIG. 9, any number may be used. The three switchable resistor components are coupled to the supply voltage input of first VCO 304, which in turn is coupled to the $V_{DD}$ power supply voltage at node 314.

FIG. 9 shows the example VCO circuit 600 having a second PMOS source follower transistor $M_8$ having a gate for receiving the $Vin_n$ input signal, a drain coupled to ground, and a second plurality of switchable resistor components coupled to the source of source follower transistor $M_8$. A first switchable resistor component comprises a first transmission gate $T_{4A}$ coupled to a first resistor element 312A, wherein the gate of transmission gate $T_{4A}$ receives the $Ctr_N$ control signal and an inverted control signal. A second switchable resistor component comprises a second transmission gate $T_{4B}$ coupled to a second resistor element 312B, wherein the gate of transmission gate $T_{4B}$ receives the $Ctr_2$ control signal and an inverted control signal. A third switchable resistor component comprises a third transmission gate $T_{4C}$ coupled to a third resistor element 312C, wherein the gate of transmission gate $T_{4C}$ receives the $Ctr_1$ control signal and an inverted control signal. While three switchable resistor components are shown in FIG. 6, any number may be used. The three switchable resistor components are coupled to the supply voltage input of second VCO 308, which in turn is coupled to ground.

Figure 10:
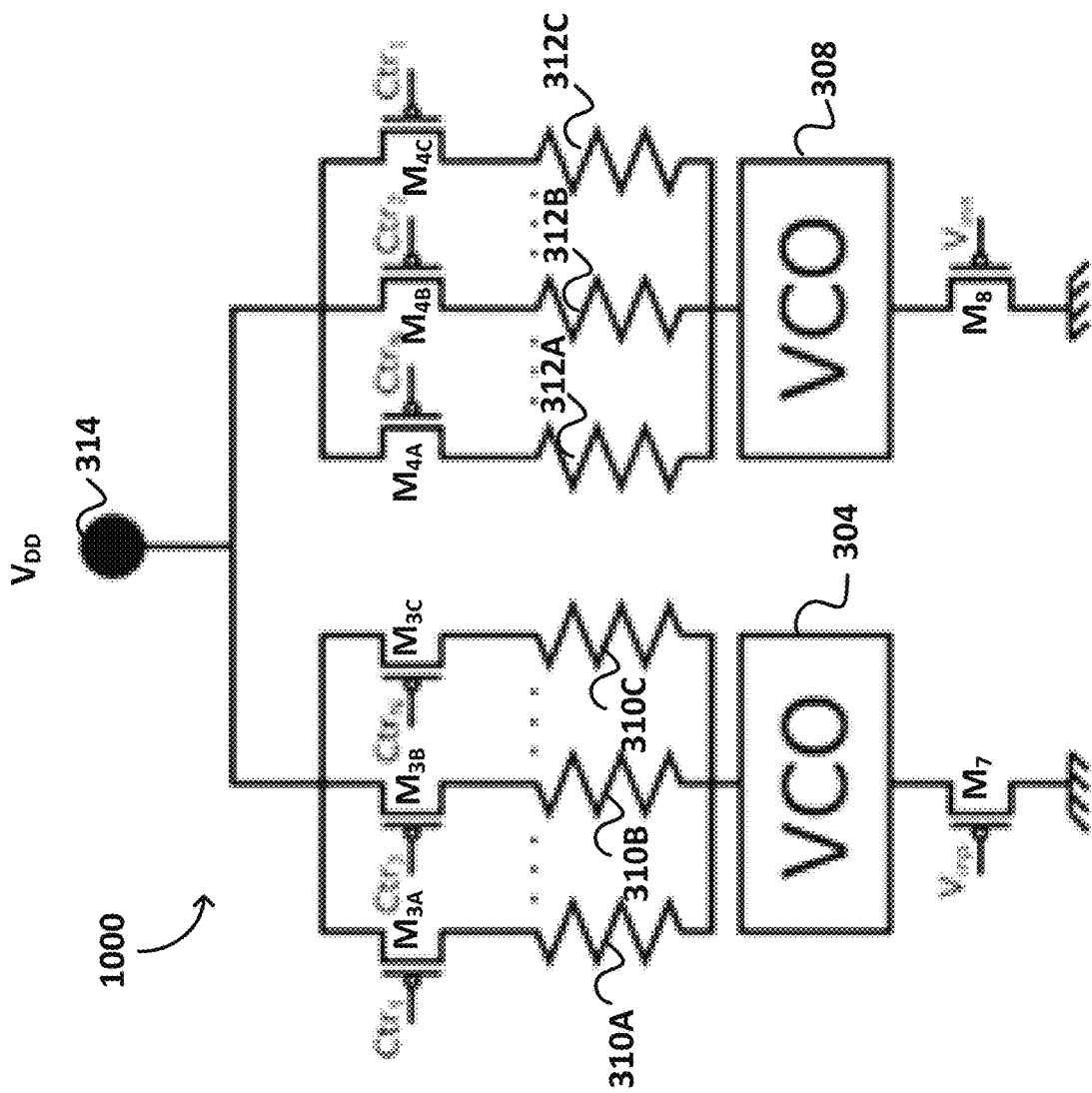
FIG. 10 is a schematic diagram of a VCO circuit having PMOS source followers and PMOS transistors for switching resistor elements, according to an embodiment.

FIG. 10 shows an example VCO circuit 1000 having a first PMOS source follower transistor $M_7$ having a gate for receiving the $Vin_p$ input signal, a drain coupled to the ground, and a first current terminal of first VCO 304 coupled to the source of source follower transistor $M_7$. A first plurality of switchable resistor components is coupled to a second current terminal of first VCO 304. A first switchable resistor component comprises a first PMOS switching transistor $M_{3A}$ coupled to a first resistor element 310A, wherein the gate of transistor $M_{3A}$ receives the $Ctr_1$ control signal. A second switchable resistor component comprises a second PMOS switching transistor $M_{3B}$ coupled to a second resistor element 310B, wherein the gate of transistor $M_{3B}$ receives the $Ctr_2$ control signal. A third switchable resistor component comprises a third PMOS switching transistor $M_{3C}$ coupled to a third resistor element 310C, wherein the gate of transistor $M_{3C}$ receives the $Ctr_N$ control signal. While three switchable resistor components are shown in FIG. 10, any number may be used.

FIG. 10 shows the example VCO circuit 700 having a second source follower transistor $M_8$ having a gate for receiving the $Vin_n$ input signal, a drain coupled to ground, and a first current terminal of second VCO 308 coupled to the source of source follower transistor $M_8$. A second plurality of switchable resistor components is coupled to a second current terminal of second VCO 308. A first switchable resistor component comprises a first PMOS switching transistor $M_{4A}$ coupled to a first resistor element 312A, wherein the gate of transistor $M_{4A}$ receives the $Ctr_N$ control signal. A second switchable resistor component comprises a second PMOS switching transistor $M_{4B}$ coupled to a second resistor element 312B, wherein the gate of transistor $M_{4B}$ receives the $Ctr_2$ control signal. A third switchable resistor component comprises a third PMOS switching transistor $M_{4C}$ coupled to a third resistor element 312C, wherein the gate of transistor $M_{4C}$ receives the $Ctr_1$ control signal. While three switchable resistor components are shown in FIG. 10, any number may be used.

In FIGS. 5-7 and 8-10, the variable resistor of the VCO-ADC has been shown as including a plurality of switchable resistor components, each switchable resistor component having a single switch an a single resistor element. The resistor elements can be equal in value to the other resistor elements in the variable resistor, or can have a different value in embodiments. However, other types of switchable resistor components can be used to further configure the variable resistor as is described below with respect to FIG. 11.

Figure 11:
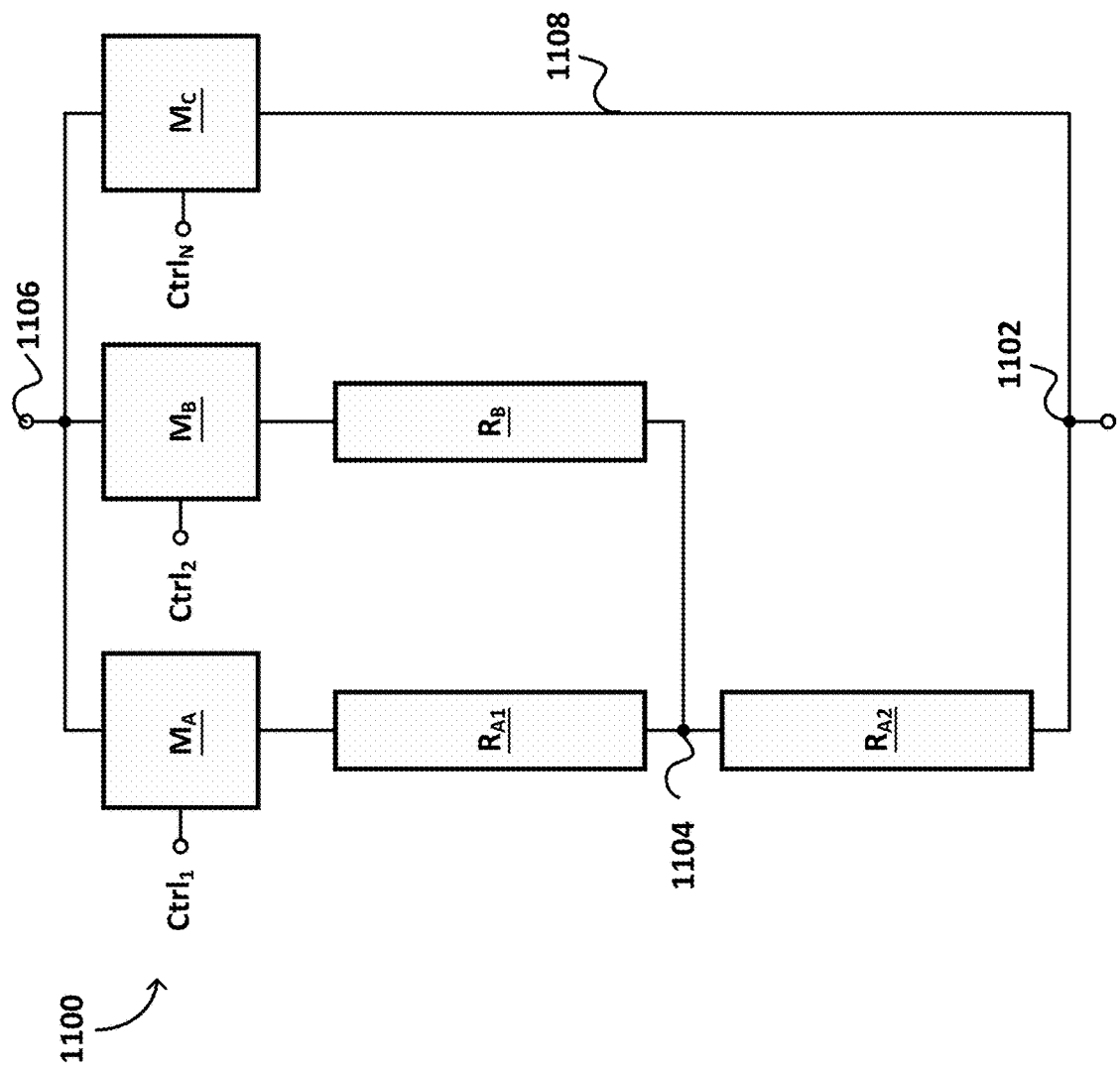
FIG. 11 is a schematic diagram of additional resistor switching components, according to an embodiment.

FIG. 11 is a schematic diagram of additional switchable resistor components 1100 for a VCO circuit of a VCO-ADC, according to an embodiment. A first switchable resistor component includes a first switch $M_A$ for receiving a first control signal $Ctrl_1$ coupled to serially-coupled resistor elements $R_{A1}$ and $R_{A2}$. The first switchable resistor component is coupled between circuit node 1102 and circuit node 1106, which can be any of the circuit nodes for the VCO circuit previously described with respect to FIGS. 5-7 and 8-10. A second switchable resistor component includes a second switch $M_B$ for receiving a second control signal $Ctrl_2$ coupled to resistor element $R_B$. The second switchable resistor component is coupled between circuit node 1106 and a tap node 1104 between coupled resistor elements $R_{A1}$ and $R_{A2}$ of the first switchable resistor component. A third switchable resistor component includes a third switch $M_C$ for receiving a third control signal $Ctrl_N$ that is coupled to circuit node 1106 and directly to circuit node 1102 through a short circuit 1108. One or more of the additional switchable resistor components 1100 can be combined as desired with the switchable resistor components previously described with respect to FIGS. 5-7 and 8-10 to provide additional embodiment variable resistor configurations.

Figure 12:
FIG. 12 is a table of laboratory tests results for various operational modes of a VCO-ADC, according to an embodiment.

The VCO-ADC system architecture described herein has been tested in the laboratory using the following parameters: Input tone level=94 dBSPL (dB Sound Pressure Level); Input tone frequency=1 kHz; Clock frequency=3.072 MHz; and Bandwidth=20 kHz. Table 1200 of FIG. 12 shows the laboratory tests results obtained using the above parameters. In Table 1200 a plurality of resistor values of a variable resistor are shown, with a corresponding resistor mode designation, a corresponding oscillator rest frequency, a corresponding current consumption, and a corresponding SNDR[dBA]. While eight resistor modes (R1, R2, R3, R4, R5, R6, R7, and R8) and a short circuit mode (Short) are shown, any number of resistor modes can be used for setting the value of the variable resistor in the VCO-ADC(s). The resistor modes can represent operational modes of the VCO-ADC, or can be used as stepped transitional modes between other operational modes. For example, in a short circuit resistor mode the variable resistor is set to a minimum of zero ohms and a maximum oscillator rest frequency ($f_o$) is 19.44 MHz, a maximum current consumption is 277 µA, and a maximum SNDR[dBA] is 71.5. In the R8 resistor mode the variable resistor is set to a maximum of 9469.4 ohms and a minimum oscillator rest frequency ($f_o$) is 7.19 MHz, a minimum current consumption is 87 µA, and a minimum SNDR[dBA] is 67.3. In the example intermediate R4 resistor mode the variable resistor is set to 2391.2 ohms and the oscillator rest frequency ($f_o$) is 12.52 MHz, current consumption is 173 µA, and the SNDR[dBA] is 69.5. From a review of the resistor modes and table entries in Table 1200 it is shown that as the variable resistor increases in value from a short circuit to the maximum value, the oscillator rest frequency, the current consumption and the SNDR each decrease from a maximum value to a minimum value. While particular resistor modes and resistor values are shown in FIG. 12, other resistor modes and resistor values can be used in embodiments. Different resistor modes and resistor values may result in different oscillator rest frequencies, current consumption values, and SNDR values.

Figure 13:
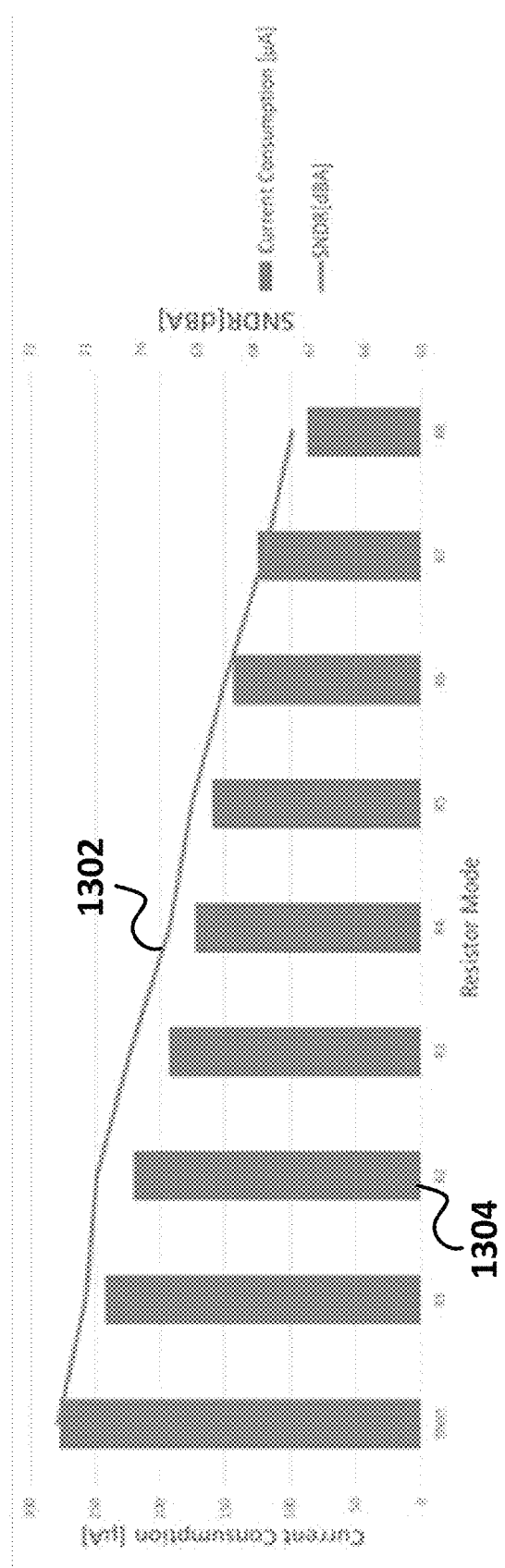
FIG. 13 is a graph of variation of current consumption and the corresponding signal to noise and distortion ratio (SNDR) of a VCO-ADC, according to an embodiment.

A summary of the laboratory tests described above is presented in graphical form in FIG. 13, in which decreasing current consumption 1304 is shown for all of the resistor modes (Short and R1-R8), as well as a decreasing signal-to-noise and distortion ratio (SNDR) 1302. The short circuit resistor mode provides the maximum current consumption and maximum SNDR, and resistor mode R8 provides the minimum current consumption and minimum SNDR, as was described above with respect to FIG. 12.

In summary, VCO-ADC embodiments and embodiment methods to change power and quantization noise in a digital microphone through the use of a controlled variable resistor in series communication with a source follower circuit have been described. By changing the rest frequency of the VCO in the VCO-ADC power and quantization noise for a given application can be optimized. Embodiment methods advantageously allow the rapid changing of power modes and optionally in intermediate steps while the VCO-ADC integrated circuit is online.

Example embodiments of the present invention are summarized here. Other embodiments can also be understood from the entirety of the specification and the claims filed herein.

Example 1. According to an embodiment, a voltage-controlled oscillator analog-to-digital converter (VCO-ADC) includes a first source follower coupled between a first input terminal and a first internal node; a first VCO having an input coupled to a second internal node; a first variable resistor coupled between the first internal node and the second internal node; and a digital signal processing component coupled between an output of the first VCO and a output terminal.

Example 2. The VCO-ADC of Example 1 further including a second source follower coupled between a second input terminal and a third internal node; a second VCO having an input coupled to a fourth internal node and an output coupled to the digital signal processing component; and a second variable resistor coupled between the third internal node and the fourth internal node.

Example 3. The VCO-ADC of any of the above examples, wherein the first source follower includes an NMOS source follower.

Example 4. The VCO-ADC of any of the above examples, wherein the first source follower includes a PMOS source follower.

Example 5. The VCO-ADC of any of the above examples, wherein the first variable resistor includes a plurality of switchable resistor components having a control signal input.

Example 6. The VCO-ADC of any of the above examples, wherein the digital signal processing component includes a counter.

Example 7. According to an embodiment, a voltage-controlled oscillator (VCO) circuit includes a source follower; a variable resistor having a control signal input; and a VCO, wherein a current path of the VCO, a current path of the variable resistor, and a current path of the source follower are in series communication.

Example 8. The VCO circuit of Example 7, wherein the source follower includes an NMOS source follower and the variable resistor includes a plurality of resistor elements coupled to a plurality of PMOS transistors.

Example 9. The VCO circuit of any of the above examples, wherein the source follower includes an NMOS source follower and the variable resistor includes a plurality of resistor elements coupled to a plurality of transmission gates.

Example 10. The VCO circuit of any of the above examples, wherein the source follower includes an NMOS source follower and the variable resistor includes a plurality of resistor elements coupled to a plurality of NMOS transistors.

Example 11. The VCO circuit of any of the above examples, wherein the source follower includes a PMOS source follower and the variable resistor includes a plurality of resistor elements coupled to a plurality of NMOS transistors.

Example 12. The VCO circuit of any of the above examples, wherein the source follower includes a PMOS source follower and the variable resistor includes a plurality of resistor elements coupled to a plurality of transmission gates.

Example 13. The VCO circuit of any of the above examples, wherein the source follower includes a PMOS source follower and the variable resistor includes a plurality of resistor elements coupled to a plurality of PMOS transistors.

Example 14. According to an embodiment, a method of operating a voltage-controlled oscillator analog-to-digital converter (VCO-ADC) including a variable resistor in a current path of a VCO of the VCO-ADC includes placing the VCO-ADC into a first operational mode by setting the variable resistor to a first resistor value; and placing the VCO-ADC into a second operational mode by setting the variable resistor to a second resistor value different from the first resistor value.

Example 15. The method of Example 14, wherein placing the VCO-ADC into a first operational mode includes placing the VCO-ADC into a high power operational mode and wherein placing the VCO-ADC into a second operational mode includes placing the VCO-ADC into a low power operational mode.

Example 16. The method of any of the above examples, wherein placing the VCO-ADC into a first operational mode includes placing the VCO-ADC into a low quantization noise operational mode and wherein placing the VCO-ADC into a second operational mode includes placing the VCO-ADC into a high quantization noise operational mode.

Example 17. The method of any of the above examples, wherein setting the variable resistor to a first resistor value includes setting the variable resistor to a low resistor value and wherein setting the variable resistor to a second resistor value includes setting the variable resistor to a high resistor value.

Example 18. The method of any of the above examples, wherein setting the variable resistor to a first resistor value includes programming a plurality of digital inputs of the variable resistor to a first code and wherein setting the variable resistor to a second resistor value includes programming the plurality of digital inputs of the variable resistor to a second code.

Example 19. The method of any of the above examples, further including placing the VCO-ADC into a third operational mode by setting the variable resistor to a third resistor value different from the first resistor value and different from the second resistor value.

Example 20. The method of any of the above examples, wherein the VCO-ADC receives an analog input signal from a microelectromechanical system (MEMS) and provides a digital output signal corresponding to the analog input signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A voltage-controlled oscillator analog-to-digital converter (VCO-ADC) comprising:
   a first source follower coupled between a first input terminal and a first internal node;
   a first VCO having an input coupled to a second internal node;
   a first variable resistor coupled between the first internal node and the second internal node; and
   a digital signal processing component coupled between an output of the first VCO and a output terminal.

2. The VCO-ADC of claim 1 further comprising:
   a second source follower coupled between a second input terminal and a third internal node;
   a second VCO having an input coupled to a fourth internal node and an output coupled to the digital signal processing component; and
   a second variable resistor coupled between the third internal node and the fourth internal node.

3. The VCO-ADC of claim 1, wherein the first source follower comprises an NMOS source follower.

4. The VCO-ADC of claim 1, wherein the first source follower comprises a PMOS source follower.

5. The VCO-ADC of claim 1, wherein the first variable resistor comprises a plurality of switchable resistor components each having a control signal input.

6. The VCO-ADC of claim 1, wherein the digital signal processing component comprises a counter.

7. A voltage-controlled oscillator (VCO) circuit comprising:
   a source follower;
   a variable resistor having a control signal input; and
   a VCO,
   wherein a current path of the VCO, a current path of the variable resistor, and a current path of the source follower are in series communication, wherein the source follower comprises an NMOS source follower or a PMOS source follower, and wherein the variable resistor comprises a plurality of resistor elements coupled to a plurality of transmission gates.

8. A method of operating a voltage-controlled oscillator analog-to-digital converter (VCO-ADC) comprising a variable resistor in a current path of a VCO of the VCO-ADC, the method comprising:
   placing the VCO-ADC into a first operational mode by setting the variable resistor to a first resistor value; and
   placing the VCO-ADC into a second operational mode by setting the variable resistor to a second resistor value different from the first resistor value.

9. The method of claim 8, wherein placing the VCO-ADC into a first operational mode comprises placing the VCO-ADC into a high power operational mode and wherein placing the VCO-ADC into a second operational mode comprises placing the VCO-ADC into a low power operational mode.

10. The method of claim 8, wherein placing the VCO-ADC into a first operational mode comprises placing the VCO-ADC into a low quantization noise operational mode and wherein placing the VCO-ADC into a second operational mode comprises placing the VCO-ADC into a high quantization noise operational mode.

11. The method of claim 8, wherein setting the variable resistor to a first resistor value comprises setting the variable resistor to a low resistor value and wherein setting the variable resistor to a second resistor value comprises setting the variable resistor to a high resistor value.

12. The method of claim 8, wherein setting the variable resistor to a first resistor value comprises programming a plurality of digital inputs of the variable resistor to a first code and wherein setting the variable resistor to a second resistor value comprises programming the plurality of digital inputs of the variable resistor to a second code.

13. The method of claim 8, further comprising placing the VCO-ADC into a third operational mode by setting the variable resistor to a third resistor value different from the first resistor value and different from the second resistor value.

14. The method of claim 8, wherein the VCO-ADC receives an analog input signal from a microelectromechanical system (MEMS) and provides a digital output signal corresponding to the analog input signal.

* * * * *